(12) United States Patent
Hayashi

(10) Patent No.: US 6,329,715 B1
(45) Date of Patent: Dec. 11, 2001

(54) PASSIVE ELECTRONIC PARTS, IC PARTS, AND WAFER

(75) Inventor: Katsuhiko Hayashi, Narita (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/147,852

(22) PCT Filed: Sep. 22, 1997

(86) PCT No.: PCT/JP97/03365

§ 371 Date: Mar. 22, 1999

§ 102(e) Date: Mar. 22, 1999

(87) PCT Pub. No.: WO98/12744

PCT Pub. Date: Mar. 26, 1998

(30) Foreign Application Priority Data

Sep. 20, 1996 (JP) .................................................. 8-250727
Apr. 16, 1997 (JP) .................................................. 9-099448

(51) Int. Cl.[7] .......................... H01L 23/12; H01L 23/15; H05K 1/03; H05I 1/00; H03T 7/00

(52) U.S. Cl. ...................... 257/724; 257/703; 257/532; 257/528; 257/531; 257/741; 257/723; 257/666; 257/728

(58) Field of Search .................................. 257/723–725, 257/684, 685, 727, 728, 703, 701, 702, 794, 788, 789, 773, 532, 705, 528, 531, 741, 752, 606

(56) References Cited

U.S. PATENT DOCUMENTS

| | | | |
|---|---|---|---|
| 4,313,900 | * | 2/1982 | Gonzales, Jr. et al. ................. 264/61 |
| 4,546,406 | * | 10/1985 | Spinelli et al. ........................ 361/386 |
| 4,665,468 | * | 5/1987 | Dohya ................................... 361/414 |
| 4,736,521 | * | 4/1988 | Dohya .................................... 29/830 |
| 5,153,709 | * | 10/1992 | Fukuoka . |
| 5,292,688 | * | 3/1994 | Hsiao et al. . |
| 5,450,045 | * | 9/1995 | Miura et al. ........................... 333/1.1 |
| 5,487,931 | * | 1/1996 | Annacone et al. ................... 428/64.1 |
| 5,491,116 | * | 2/1996 | Beall et al. ............................... 501/5 |
| 5,497,033 | * | 3/1996 | Fillion et al. ......................... 257/723 |
| 5,629,838 | * | 5/1997 | Knight et al. ......................... 361/782 |
| 5,644,322 | * | 7/1997 | Onyskevych et al. ................. 345/80 |
| 5,742,026 | * | 4/1998 | Dickinson, Jr. et al. ....... 219/121.69 |
| 5,880,705 | * | 3/1999 | Onyskevych et al. ................. 345/80 |
| 5,888,884 | * | 3/1999 | Wojnarowski ....................... 438/462 |
| 5,904,499 | * | 5/1999 | Pace ..................................... 438/108 |
| 5,920,142 | * | 7/1999 | Onishi et al. ......................... 310/348 |
| 5,949,654 | * | 9/1999 | Fukuoka ............................... 257/723 |
| 5,998,876 | * | 12/1999 | Carter et al. ......................... 257/778 |
| 6,038,133 | * | 3/2000 | Nakatani et al. .................... 257/635 |
| 6,113,730 | * | 9/2000 | Ohya et al. ....................... 156/307.3 |
| 6,114,938 | * | 9/2000 | Iida et al. ............................. 257/531 |
| 6,116,863 | * | 9/2000 | Ahn et al. ............................. 417/322 |
| 6,209,352 | * | 4/2001 | Beall et al. ............................ 65/30.1 |

FOREIGN PATENT DOCUMENTS

| | | |
|---|---|---|
| 8-330136 | 12/1996 | (JP) . |
| 8-330154 | 12/1996 | (JP) . |
| 8-330169 | 12/1996 | (JP) . |
| 9-83144 | 3/1997 | (JP) . |
| 9-83145 | 3/1997 | (JP) . |

OTHER PUBLICATIONS

Mitsubishi Electric Technical Report, vol. 67, No. 11, pp. 45–48, "UHF Band High Efficiency FET Amplifier for Mobile Communications", 1993.

* cited by examiner

Primary Examiner—Alexander O Williams
(74) Attorney, Agent, or Firm—Oblon, Spivak, McClelland, Maier & Neustadt, P.C.

(57) ABSTRACT

Passive electronic parts containing a substrate (1) and a passive circuit (2). The substrate (1) has an inorganic insulating layer (11) composed of a mixture of a ceramic component and glass component. The passive circuit (2) is composed of a conductor pattern in general and provided on one surface (111) of the insulating layer (11). It is preferable to polish the surface (111) of the insulating layer (11) on which the circuit (2) is formed. An electronic part can be designed for a smaller pattern area by making the conductive pattern finer.

14 Claims, 12 Drawing Sheets

PASSIVE ELECTRONIC PARTS, IC PARTS, AND WAFER

TECHNICAL FIELD

The present invention relates to a passive electronic part, and IC part that includes this passive electronic part, and a wafer used for obtaining the passive electronic part. The passive electronic part and the IC part according to the present invention are ideal to be employed as surface mounting high frequency parts utilized in application areas such as radio devices including cellular phones, car phones and the like, and various other types of communication devices.

BACKGROUND ART

IC parts used in the high frequency circuit portion of a cellular phone or the like in the known art include MMICs (monolithic microwave integrated circuits), which are described in "UHF Band High Efficiency FET Amplifier for Mobile Communications" published in Mitsubishi Electric Technical Report, Vol. 67, No. 11, 1993. The MMICs in the known art include three types.

The first type of MMIC is formed by constituting the active circuit portion comprising a plurality of active elements in the form of an IC chip and by forming the circuit portion constituted of a passive element on the surface of the IC chip package through thick film printing or the like. With the first type, since the passive circuit which only occupies the pattern area, is separated from the GaAs (gallium—arsenic) substrate and only the active circuit constituted of active elements such as transistors can be formed on the GaAs substrate which can be miniaturized, thereby achieving a reduction in the production cost of the IC part as a whole.

Next, with the second type of MMIC, the passive circuit portion constituted of passive elements such as filter portions is integrated on the IC chip substrate constituted of active elements into a single chip. With the second type, by forming the passive circuit portion on the GaAs substrate where the active circuit constituted of active elements such as a plurality of transistors is formed, the passive circuit and the active circuit can be manufactured at the same time through the same process, thereby achieving an extremely high degree of mass productivity. Moreover, from the viewpoint of manufacturers of semiconductor parts, the second type provides potential for achieving a reduction in the cost of the entire IC part since it does not require any ceramic chip carrier, which normally must be purchased.

The third type of MMIC is constituted by forming the passive circuit portion and the active circuit portion on separate IC substrates although these IC substrates are of the same type. Normally, in a high frequency band exceeding several GHz to several tens of GHz, the active circuit portion is formed by using a compound semiconductor constituted of GaAs or the like. Furthermore, a GaAs substrate, with its specific resistance at $10^8$ Ωcm or more, provides superior insulation compared to Si, whose specific resistance is approximately $2.3 \times 10^5$ Ωcm. Thus, a great deal of interest is focused on the advantage that a passive element such as a coil that can be used in the high frequency band may be formed on a GaAs substrate, and currently, development of high frequency MMIC circuits by employing a GaAs substrate is underway.

With the third type, since the active circuit portion and the passive circuit portion can be manufactured through the same process and the passive circuit portion is provided on a separate chip, it is possible to limit the portion that requires changes in design (impedance, etc.) in correspondence to the frequency band that is used. Because of this, by commonly using IC chips for the active circuit portion and by simply changing the IC chip for the passive circuit portion, it becomes possible to produce a series of IC parts in correspondence to various frequency bands. In particular, a GaAs substrate with a special additive included may be employed in order to draw out certain transistor characteristics in the high frequency band, and such a GaAs substrate tends to be a great deal more expensive than a normal GaAs substrate. Thus, by using different GaAs substrates for the active circuit portion, which is constituted of active elements requiring the semiconductor characteristics in the high frequency band and for the passive circuit portion constituted of passive elements that do not require the semiconductor characteristics, IC parts can be manufactured at a lower cost.

However, in the case of the first type of MMIC, the ceramic IC package in which the active electronic parts are mounted, is a component that must be purchased as far as a manufacturer of semiconductor parts is concerned. Thus, IC parts employing ceramic IC packages tend to be more expensive than IC parts with regular resin mold packages.

In addition, in the case of the second type of MMIC, since it is necessary to design the IC by adding an impedance matching circuit for each frequency to be used, its versatility as a part is poor.

Furthermore, with the second and third type of MMIC, while a GaAs substrate required for constituting the MMIC provides superior insulation, it is still extremely expensive, and it is difficult, therefore, to reduce the product cost.

Moreover, while, with the second and third types of MMIC, it is desirable to employ a conductor such as silver, copper or the like with a low specific resistance for the pattern of the passive elements formed on the MMIC, since these conductors react with the GaAs substrate, it is extremely difficult to use them in practice.

In addition, while the pattern of the passive elements is formed on a GaAs substrate in both the second type and the third type of MMIC, it is necessary to implement grounding for the ground electrodes frequently in the passive circuit. Normally, in the structure of the substrate for constituting the passive circuit, the wiring layer on the substrate assumes a multilayer structure, a planar pattern of the ground electrodes is set in the lower layer and a signal line is set at a layer above it. If there is a node that requires grounding in the passive circuit (an electrode pattern within the circuit), the node is grounded to the ground electrode via a through—hole electrode. In order to achieve this substrate structure with a GaAs substrate, a method whereby a ground electrode is formed on the opposite side from the side where the circuit elements on the GaAs substrate are formed may be considered as a first option. Also a method may be considered whereby a ground electrode is first constituted on a surface where the elements are formed, next, an inorganic insulating layer is formed on the ground electrode and then a signal electrode is formed on the inorganic insulating layer as a second option.

However, with the first method, it is necessary to form holes passing through both the front and rear surfaces of the GaAs substrate being used, these holes, which are extremely fine, must be formed in great numbers and the internal surfaces of these holes must be made electrically continuous by conductors, all of which are practically impossible to achieve.

In addition, in the second method, the inorganic insulating layer formed between the ground electrode and the signal electrode is normally formed through vapor phase epitaxy since a high temperature process must be employed in the semiconductor manufacturing process. However, the inorganic insulating layer will achieve a thickness of only several microns through vapor phase epitaxy. This will result in a reduced line impedance in the signal line formed on the inorganic insulating layer, which, in turn, makes the circuit design extremely difficult. The line impedance in the high frequency band, in particular, will be extremely low. As a means for avoiding a reduction in impedance, the width of the signal line may be set at an extremely small value, but since the conductors are constituted of a thin film and, therefore, their thickness is at approximately several microns, if the width of the signal line is set at an extremely small value, the high frequency resistance will further increase, resulting in an increase in signal insertion loss.

Next, for high frequency circuits handling 100 MHz or more, various surface mounted high frequency passive electronic parts, which include passive circuits only, have been proposed and put into practical use. For instance, Japanese Unexamined Patent Publication No. 330136/1996, Japanese Unexamined Patent Publication No. 330154/1996 and Japanese Unexamined Patent Publication No. 330169/1996 disclose high frequency coils. To achieve the high frequency coils disclosed in these prior art publications, a spiral coil electrode pattern is formed on a ceramic substrate and the two ends of the coil electrode pattern are drawn out to the end portions of the substrate facing opposite each other to constitute a chip coil. As a means for coil electrode formation, thick film printing technologies, wet plating technologies, thin film technologies and the like are employed.

In the method employing thick film printing, since production can be carried out requiring only simple production facilities compared to facilities required for semiconductor production, an advantage is achieved in that production cost can be reduced. However, since the patterns are formed through screen printing, it is difficult to form extremely fine lines of 100 microns or less. Moreover, since smudging and blurring of the conductors tends to occur during conductor pattern printing, inconsistencies in the conductor width and the conductor film thickness may easily result. These negative factors ultimately result in problems in that, in the case of a high frequency coil, for instance, there is a limit to how fine the pattern can be made and there is also a limit to the extent of miniaturization that can be achieved and in that the inductance value tends to be inconsistent.

In the case of a method employing wet plating or the like, it is difficult to control the concentration of the plating solution in the plating bath at a constant level. In addition, since a processing facility for processing the waste liquid of the plating solution is required, the method tends to require large scale production facilities. Thus, production costs cannot be kept low. Furthermore, electroless plating must be performed in order to directly plate onto a ceramic substrate and this means that a great deal of time is required for the plated film to grow. In addition, the thickness of the plated film cannot be set larger than the film thickness achieved when thick film printing is employed. Thus, with a high frequency coil, for instance, it is difficult to achieve a high coil Q value.

The thin film technologies are extremely effective for achieving very fine electrode patterns, for achieving a high degree of accuracy in the electrical characteristics and for achieving miniaturization of parts. However, warpage resulting from firing normally occurs in a ceramic substrate. Because of this, it is difficult to adopt ceramic substrates in semiconductor manufacturing technology. For instance, in the photolithography process, the distance between the photo-mask and the wafer constituted of a ceramic substrate becomes inconsistent at different points on the surface of the wafer due to the warpage of the wafer, resulting in a reduced pattern accuracy.

DISCLOSURE OF THE INVENTION

It is an object of the present invention to provide a passive electronic part or an IC part such as an IC chip with which the pattern area can be designed small by achieving an extremely fine conductor pattern.

It is a further object of the present invention to provide a passive electronic part or an IC part provided with a substrate with a smooth surface that is free of defects, in which warpage can be corrected easily.

It is a still further object of the present invention to provide a passive electronic part or an IC part provided with a substrate that assures good cutting characteristics and excellent mass productivity.

It is a still further object of the present invention to provide a passive electronic part or an IC part provided with a substrate that can be manufactured employing an inexpensive manufacturing method and requiring inexpensive production facilities.

It is a still further object of the present invention to provide a passive electronic part or an IC part with which the conductor pattern can be made extremely fine and with a high degree of accuracy, the accuracy of the constant values of the individual circuit elements formed can be improved, and the circuit elements and the functional circuit constituted of an aggregate of the circuit elements can be designed based upon a small pattern area.

It is a still further object of the present invention to provide a wafer that is suited for obtaining the passive electronic part or IC part described above.

In order to achieve these objects, in the passive electronic part according to the present invention, a substrate upon which a passive circuit is mounted is constituted of a compound that is achieved by mixing a ceramic constituent and a glass constituent. Advantages achieved by the passive electronic part according to the present invention described above are as follows.

First, in order to constitute a desired passive circuit on a substrate, it is necessary to design a small pattern area by achieving an extremely fine conductor pattern. For instance, in order to pattern a conductor with a width of approximately several tens of microns, a thin film process will be required.

According to the present invention, a substrate constituted of a compound achieved by mixing a ceramic constituent and a glass constituent is used and a passive circuit is formed on this substrate. The main constituent of the substrate according to the present invention is a metal oxide, and no problem is posed even when the passive circuit is formed by using a conductor with low resistance in the high frequency band, such as silver, copper or the like, on the substrate. It is possible to form a conductor with a width of, for instance, several tens of microns through a thin film process.

Second, with the passive electronic part according to the present invention, a multilayer structure can be adopted for the substrate easily, and through achieving such a multilayer structure, the overall part can be miniaturized. Furthermore, when creating a multilayer structure, a conductive layer can be enclosed between inorganic insulating layers. By using such a conductive layer as a ground electrode, the conductor pattern provided at the surface can be made electrically continuous with the ground electrode easily via a through-hole electrode, for instance, to achieve grounding. In other words, a ground electrode in the form of a solid pattern for grounding can be provided within the substrate, and the ground electrode thus provided and the electrode pattern formed at the surface of the substrate can be connected very easily at an arbitrary position.

Third, with the substrate according to the present invention, a substrate that is very smooth and virtually free of defects compared to a ceramic substrate or a glass substrate, can be achieved. In addition, because of the ceramic content, a greater strength compared to a substrate constituted of glass only is achieved. Moreover, because of the reduced fluidity during substrate production compared to a substrate constituted of only glass, it is also possible to achieve a multilayer wiring structure.

A fourth advantage is good cutting characteristics assured by the substrate according to the present invention which is constituted of a compound composition comprising a ceramic constituent and a glass constituent. Consequently, the warpage of the entire substrate occurring during the firing of the substrate and surface irregularities can be easily removed through lapping. In particular, by selecting as appropriate the mixing ratio of the glass constituent and the ceramic constituent, good cutting characteristics and strength in the substrate can be achieved practically at the same time. When cutting chips using a dicing saw or the like, good cutting is assured, thereby achieving an improvement in mass productivity.

When employing a thin film manufacturing apparatus, it is desirable that the substrate be a disk shape so that it can be used in the thin film manufacturing apparatus for semiconductor wafers. In the case of such a disk shaped substrate, the individual machining processes such as lapping of the substrate, the polishing of the external circumference and the individual chip cutting are exactly as in semiconductor wafer production. Since the substrate according to the present invention assures good cutting, the individual machining processes described above can be implemented with an extremely high degree of efficiency.

The fifth advantage of the substrate according to the present invention is that, compared to sintering a substrate constituted of ceramic only, it can be fired at a relatively low temperature of 1000° C. or lower and for a relatively short firing temperature holding time of approximately 10 minutes. Because of this, compared to a situation in which a substrate constituted of only a ceramic constituent is sintered, the required manufacturing facilities do not cost as much. Moreover, since the manufacturing time is reduced, better mass productivity is achieved. Naturally, compared to a manufacturing facility for single-crystal semiconductor substrates with a high degree of purity, the scale of the facility required and its cost are much reduced. In addition, the length of time required for manufacturing substrates is very much reduced. Thus, according to the present invention, passive electronic parts can be supplied at an extremely low cost.

The sixth point is that while, as mentioned earlier, a semiconductor using a GaAs substrate achieves extremely good characteristics in high frequency bands of several GHz to several tens of GHz or more and also achieves good substrate insulation, it is extremely costly. According to the present invention, by positioning an IC chip constituted by mounting active elements and a passive IC mounted with a circuit that is constituted only with passive elements such as impedance matching elements and filters side-by-side on a semiconductor substrate such as a GaAs substrate and by packaging these two IC chips with a single resin mold through electrical bonding, they can be produced as a single IC part.

In this case, unlike the first type of MMIC described earlier, it is not necessary to implement the various types of machining in order to form the passive IC chip at the semiconductor IC package. Because of this, by using an IC chip constituted of the passive electronic part according to the present invention, a cheaper IC part can be supplied to a manufacturer of semiconductor parts compared to a case in which the ceramic IC packages of the first type are used.

In the passive electronic part according to the present invention, the inorganic insulating layer constituting the substrate is preferably provided with a polished surface. Even though the substrate is constituted of a compound composition including a ceramic constituent and a glass constituent and even if warpage due to the firing occurs in the inorganic insulating layer that would normally be constituted of a sintered body, this warpage will have been eliminated through the polishing, thereby making it possible to form a conductor pattern on a surface without any warpage. Thus, by applying this substrate in semiconductor manufacturing technologies, a conductor pattern with a high degree of accuracy can be formed during the photolithography process. As a result, the accuracy of the constant values of the individual circuit elements that are formed can be improved and, at the same time, circuit elements and a functional circuit constituted of an aggregate of these circuit elements can be designed based upon only a small pattern.

Next, with the inorganic insulating layer constituted of the compound composition including the ceramic constituent and the glass constituent, good cutting can be assured through appropriate selection of the type of constituents, the content ratio of the individual constituents and the like. Consequently, the firing warpage of the entire substrate and the surface irregularities occurring during the firing of the substrate can be removed with ease through lapping. In addition, through the selection of the type of constituents, the content ratio of the individual constituents or the like, it is possible to achieve a passive electronic part provided with an organic insulating layer with a smooth surface that is free of defects with little warpage.

According to the present invention, the conductor pattern is used as an element constituting the passive circuit. The conductor pattern may constitute a required passive circuit by itself or may do so in combination with other components. To be more specific, the passive circuit includes at least an inductor, a capacitor or a resistor. The passive circuit above may be a single-functional circuit or it may constitute a functional circuit that combines several. Typical examples of a functional circuit achieved by such a combination are a filter, a coupler or the like. The conductor pattern and other components are selected as appropriate in correspondence to the target passive circuit to be achieved.

BRIEF DESCRIPTION OF THE DRAWINGS

Other objects, features and advantages of the present invention are explained in further detail in reference to the attached drawings which illustrate preferred embodiments.

BEST MODE FOR CARRYING OUT THE INVENTION

Figure 1:
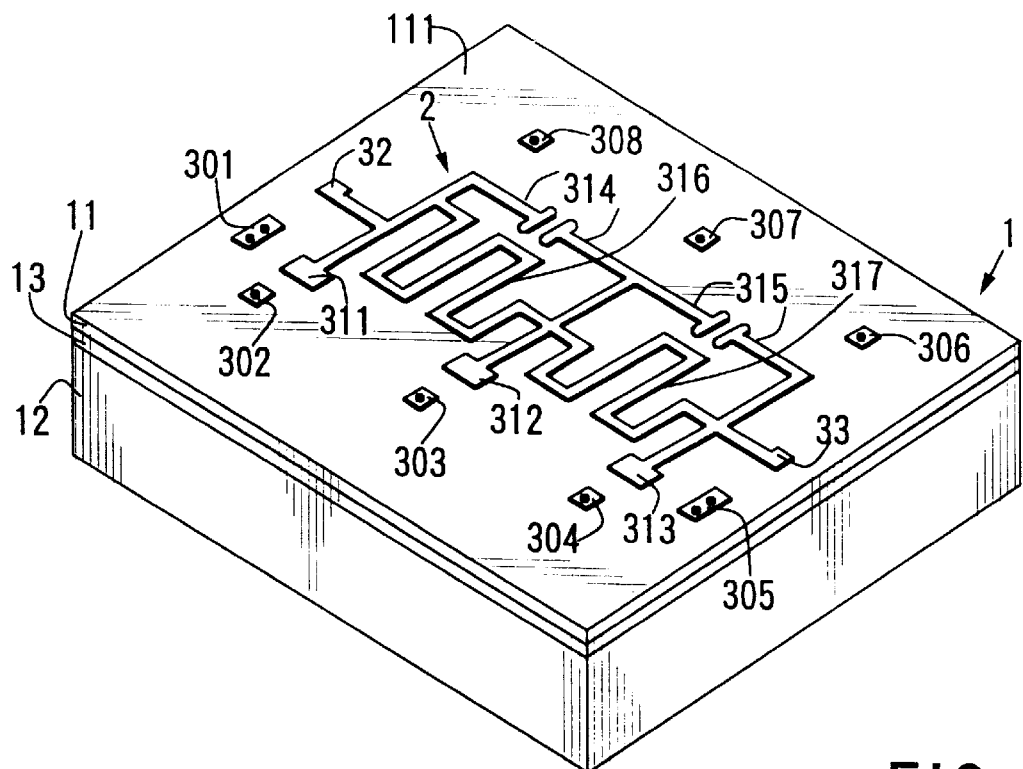
FIG. 1 is a perspective of the passive electronic part according to the present invention.
Figure 2:
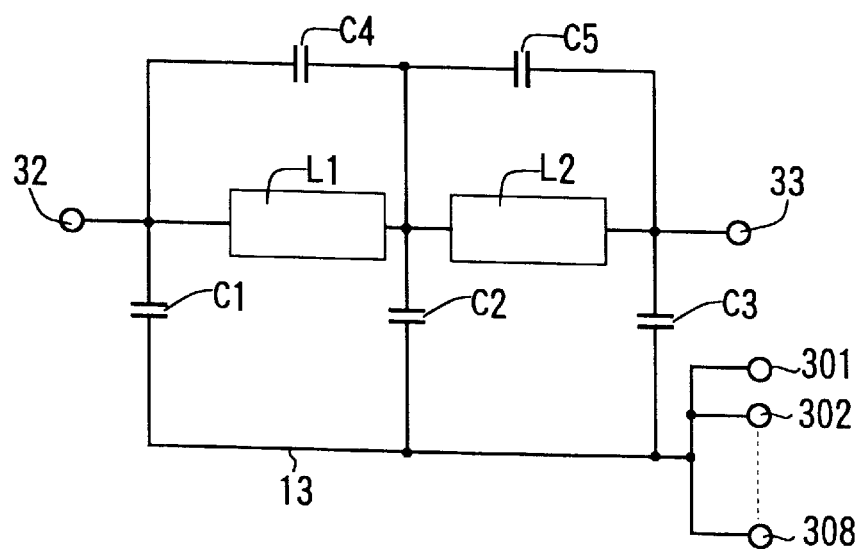
FIG. 2 is an electric circuit connection diagram of the passive electronic part shown in FIG. 1.

The passive electronic part shown in FIGS. 1 and 2 will be referred to as a passive IC chip. According to the present invention, a passive IC chip refers to a substrate that has been achieved by dividing a wafer into small sections with circuit elements formed on each. The passive IC chip in the embodiment includes a substrate 1 and a passive circuit 2. The substrate 1 is provided with an inorganic insulating layer 11 constituted of a compound composition obtained by mixing a ceramic constituent and a glass constituent.

The passive circuit 2 is provided on one surface of the inorganic insulating layer 11. At the surface of the inorganic insulating layer 11, conductor patterns 311 to 317 for the passive circuit 2, conductor patterns 301 to 308 for connection and conductor patterns 32 and 33 which are to constitute input/output terminals, are provided. These conductor patterns should preferably be constituted of thin film. It is desirable that the one side of the inorganic insulating layer 11 be a polished surface. With the inorganic insulating layer 11 provided with a polished surface, it is possible to employ a high accuracy thin film formation technology in the formation of the conductor patterns 311 to 317, 301 to 308, 32 and 33.

In the embodiment, the substrate 1 includes a first inorganic insulating layer 11 which supports the passive circuit 2 and a second inorganic insulating layer 12. The first inorganic insulating layer 11 and the second inorganic insulating layer 12 are both constituted of a composition achieved by mixing a ceramic constituent and a glass constituent. The substrate 1 is further provided with a conductive layer 13 between the first inorganic insulating layer 11 and the second inorganic insulating layer 12. The conductive layer 13 is employed as a ground electrode. The first inorganic insulating layer 11, the second inorganic insulating layer 12 and the conductive layer 13 are integrated through sintering.

The passive circuit 2 may be any passive circuit, and it is not limited to that illustrated in the figures. By way of giving a specific example, the embodiment presents a filter circuit constituted of capacitors C1 to C5 and inductors L1 and L2 as shown in FIG. 2. The capacitors C1 to C5 are obtained by the conductor patterns 311 to 315 formed at the surface of the substrate 1. Of the capacitors C1 to C5, the capacitors C1 to C3 are obtained between the conductor patterns 311 to 313 and the conductive layer 13. The capacitors C4 and C5 are obtained between the electrodes 314 and 314 and between the electrodes 315 and 315 which face opposite each other at the surface of the inorganic insulating layer 11.

The inductors L1, and L2 are obtained by the serpentine conductor patterns 316 and 317 which are constituted as microstrip lines. It is necessary to determine the line impedances of the conductor patterns 316 and 317 and their lengths, to achieve the required inductance. In this case, since the thickness of the inorganic insulating layer 11 of the substrate 1 according to the present invention can be changed freely, a high degree of freedom is afforded in setting the line impedances of the conductor patterns 316 and 317 constituting the microstrip lines. Line impedance in the microstrip lines is set in conformance to the line width, the dielectric constant and thickness of the inorganic insulating layer 11 inserted between the lines and the GND electrode. According to the present invention, the thickness of the inorganic insulating layer 11 is much greater than the film thickness of an insulating film achieved through a thin film process at, for instance, several tens of microns to 100 microns or greater. Since the inorganic insulating layer 11 is constituted of a composition constituted of a ceramic constituent and a glass constituent, such a thickness can be achieved easily. Thus, compared to a microstrip line on an inorganic layer 11 having a thickness of only a few microns achieved through thin film technology, a microstrip line with a higher line impedance can be obtained easily.

The conductor patterns 301 to 308, which are to constitute GND pad electrodes, are formed on individual through-hole electrodes set in the inorganic insulating layer 11, and the conductor patterns 32 and 33 which are to constitute input/output terminals are also formed on the inorganic insulating layer 11, to achieve a structure which enables wire bonding.

In order to form a desired passive circuit 2 on the substrate 1 structured as described above, it is necessary to allow only a small pattern area in the design by making the conductor patterns very fine. For instance, a thin film process is required in order to pattern a conductor whose width is approximately several tens of microns.

According to the present invention, the passive circuit 2 is formed on the substrate 1 provided with the inorganic insulating layers 11 and 12 each constituted of a composition achieved by mixing a ceramic constituent and a glass constituent. The main constituent of the inorganic insulating layers 11 and 12 constituting the substrate 1 is a metal oxide, and no problem is posed if the conductor patterns 311 to 317 for the passive circuit 2 are formed on the substrate 1 by using conductors constituted of silver, copper or the like, which offer low resistance in the high frequency band. For instance, the conductor patterns 311 to 317 with their widths at approximately several tens of microns can be formed through a thin film process.

Furthermore, the substrate 1 with the composition described above, can achieve a multilayer structure easily and through such a multilayer structure, miniaturization of the entire passive IC chip becomes possible.

In addition, with a greater number of layers, the conductive layer 13 can be enclosed between the inorganic insulating layers 11 and 12 as shown in FIG. 1. By using such a conductive layer 13 as a ground electrode, the conductor patterns 301 to 308 provided at the surface of the insulating layer 11 can be made electrically continuous with the conductive layer 13 constituting the ground electrode via the through-hole electrodes at any location with a high degree of ease, for grounding.

Moreover, the substrate 1 according to the present invention constituted of a compound composition including a ceramic constituent and a glass constituent achieves the following advantages over substrates constituted of ceramic or glass only.

In the case of a ceramic substrate, fine particles form grain boundaries to reach a sintered state, resulting in a great number of defects and poor smoothness. Furthermore, when firing the substrate, the so-called firing warpage occurs over the entire substrate. In the case of a glass substrate, its cutting characteristics are good for polishing compared to a ceramic substrate, with an extremely small number of defects and a high degree of smoothness assured. However, since the glass constituent has fluidity, it is not suited for constituting a substrate with a multilayer wiring structure. In addition, the strength of the substrate is poor.

In contrast, the inorganic insulating layer 11 constituted of a compound composition including a ceramic constituent and a glass constituent can achieve good cutting, a high degree of surface smoothness and the like at practically the same time by selecting as appropriate the mixing ratio and the actual composition of the glass constituent and the ceramic constituent. When it is divided into individual sections with a dicing saw or the like in order to obtain chips, good cutting is assured and an improvement in mass productivity is achieved. Consequently, the firing warpage of the entire substrate and the irregularities occurring during the firing of the substrate can be removed easily through lapping. In addition, through appropriate selection of the types of inorganic constituents of the inorganic insulating layer 11, the content ratio of the individual constituents and the like, it is possible to achieve a passive electronic part provided with an inorganic insulating layer 11 that has a smooth surface that is free of defects with less warpage. Furthermore, because of the reduced fluidity during substrate production compared to a substrate constituted of glass only, a multilayer wiring structure can be achieved.

Moreover, with the ceramic constituent included, the strength is increased compared to that of a substrate constituted of glass only. Because of this, after being made into chips, damage or cracking does not occur when being mounted on a lead frame by a mounting machine or even during an ultrasonic bonding process for wire bonding.

The inorganic insulating layer 11 constituted of the compound composition including the ceramic constituent and the glass constituent can be fired at a relatively low temperature of 1000° C. or lower and for a relatively short firing temperature holding time of approximately 10 minutes compared to sintering a substrate constituted of ceramic only.

Because of this, compared to a situation in which a substrate constituted of only a ceramic constituent is fired, the required manufacturing facilities do not cost as much. Moreover, since the manufacturing time is reduced, better mass productivity is achieved.

Since the inorganic insulating layer 11 according to the present invention is constituted of a compound composition comprising a ceramic constituent and a glass constituent, good cutting is assured. In particular, when the glass constituent is mixed at a ratio of 50% or more and especially when it is mixed at a ratio of 60 to 70% by volume against the ceramic constituent, good cutting and sufficient strength of the substrate can be achieved practically at the same time.

When used in a high frequency band exceeding 1 GHz, the insulating material with a dielectric constant ($\epsilon r$) at 15 or less, more preferably at 10 or less should be used to form the first inorganic insulating layer 11 constituting the substrate 1, since, in the high frequency band, if the dielectric constant ($\epsilon r$) of the first inorganic insulating layer 11 exceeds the value given above, the floating capacity between the patterns formed cannot be disregarded, presenting a difficulty in pattern design.

The inorganic insulating layer 11 is provided with a polished surface 111. Since the inorganic insulating layer 11 is constituted of a compound composition including a ceramic constituent and a glass constituent, it typically forms a sintered body. Even if warpage due to the firing occurs in the inorganic insulating layer 11 constituted of a sintered body, this warpage will have been eliminated through the polishing, thereby making it possible to form a conductor pattern 2 on the surface 111 without any warpage. Thus, by applying this substrate through semiconductor manufacturing technology, a conductor pattern 2 with a high degree of accuracy can be formed during the photolithography process. As a result, the accuracy of the constant values of the individual circuit elements that are formed by the conductor pattern 2 can be improved and, at the same time, circuit elements and a functional circuit constituted of an aggregate of these circuit elements can be designed based upon only a small pattern.

To achieve the ceramic constituent which is used to constitute the substrate 1, one or more of the following should be selected as appropriate from the following in correspondence to the requirements for the dielectric constant ($\epsilon r$) explained above, the required firing temperature and the like: alumina ($\epsilon r \approx 10$), magnesia ($\epsilon r \approx 9$), spinel ($\epsilon r \approx 9$), silica ($\epsilon r \approx 4$), mullite ($\epsilon r \approx 6.5$), forsterite ($\epsilon r \approx 6$), steatite ($\epsilon r \approx 6$), cordierite ($\epsilon r \approx 5$), zirconia ($\epsilon r \approx 10$) and the like.

It is desirable that the content of the glass in the substrate 1 be at or greater than 50% and, in particular 60 to 70% by volume. If the glass content is less than 50%, it is difficult to achieve a composite structure, and the strength and moldability become reduced. In addition, it is desirable that the glass constituent provide a dielectric constant approximately the same as that of the ceramic constituent which constitutes the aggregate. Specific examples that satisfy this requirement include those that are normally employed as glass frits such as borosilicate glass, lead borosilicate glass, borosilicate barium glass, borosilicate strontium glass, borosilicate zinc glass and the like. Lead borosilicate glass and borosilicate strontium glass are particularly ideal. A specific example of the composition of the glass may be: $SiO_2$:50 to 65 wt %, $Al_2O_3$:5 to 15 wt %, $B_2O_3$:8 wt % or less, one to four of the following: CaO, SrO, BaO and MgO: 15 to 40 wt %, PbO:30 wt % or less. One or more selected from $Bi_2O_3$, $TiO_2$, $ZrO_2$, $Y_2O_3$ and the like may be added to the composition described above at 5 wt % or less.

A substrate material having a composite structure achieved by mixing such a glass constituent to constitute the base material and a ceramic constituent to constitute the aggregate can be fired at a low temperature.

While there are no restrictions imposed upon the electrode materials for constituting the coil conductors and the capacitors, according to the present invention it is desirable to use a conductor material with a low resistance that can be fired at a temperature of 1000° C. or less, such as Au, Ag, Ag—Pd, Cu, Pt and the like.

Figure 3:
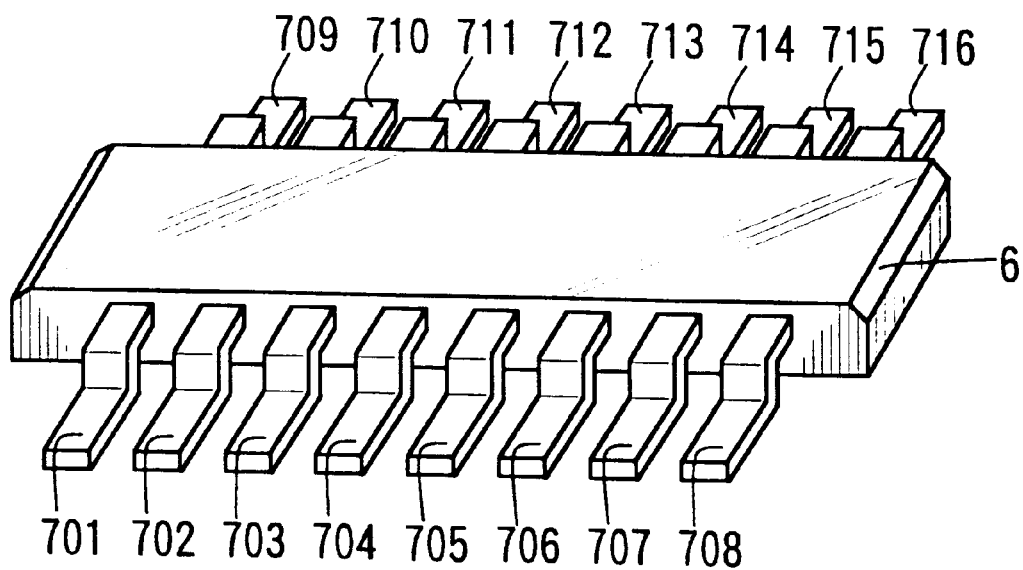
FIG. 3 is an external perspective of an IC part which is provided with both the passive electronic part according to the present invention and an active electronic part.
Figure 4:
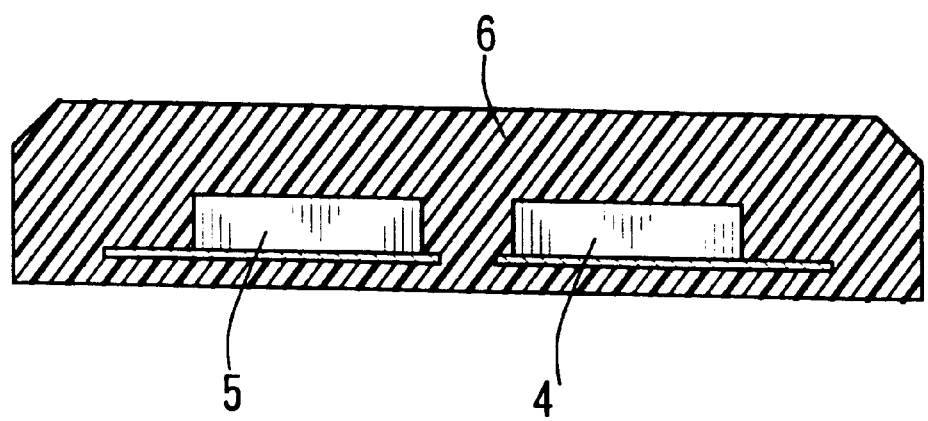
FIG. 4 is a partial cross section of the IC part shown in FIG. 3.
Figure 5:
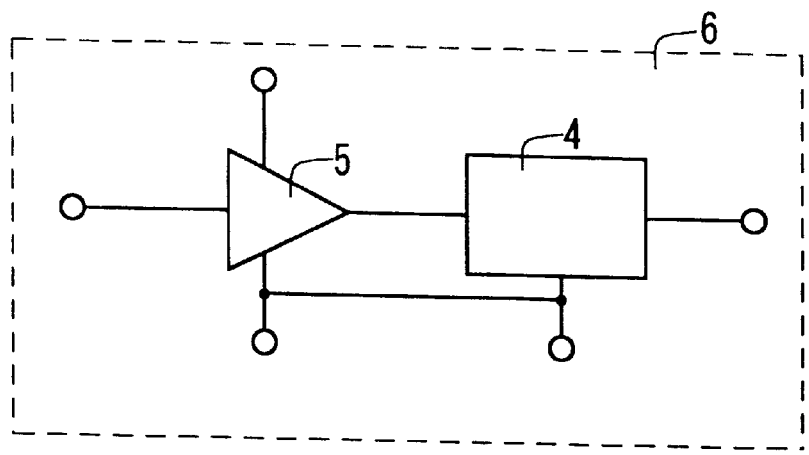
FIG. 5 is an internal connection diagram of the IC part shown in FIGS. 3 and 4.

Referring to FIGS. 3 to 5, the IC part includes at least one passive electronic part 4, at least one active electronic part 5, an insulating armor 6 and lead conductors 701 to 716. The passive electronic part 4 and the active electronic part 5 are positioned side-by-side laterally. The insulating armor 6 composed of a chosen resin covers the passive electronic part 4 and the active electronic part 5 to constitute one package. The lead conductors 701 to 716 are connected to the passive electronic part 4 and the active electronic part 5 inside the insulating armor 6 and are led out to the outside of the insulating armor 6.

The passive electronic part 4 is the passive IC chip shown in FIGS. 1 and 2 and constitutes, for instance, a filter circuit. The active electronic part 5 is a semiconductor IC chip achieved by forming an amplification stage constituted of a plurality of semiconductor elements on a GaAs semiconductor substrate and by constituting the whole as an IC chip.

As has been explained earlier, while an active electronic part 5 using a GaAs substrate achieves extremely good characteristics in a high frequency band of several GHz to several tens of GHz or more and also achieves good substrate insulation, it is extremely costly. In contrast, according to the present invention, by positioning the active electronic part 5 constituted by mounting active elements on a semiconductor substrate such as a GaAs substrate and the passive electronic part 4 achieved by mounting a circuit that is constituted only with passive elements such as impedance matching elements and filters side-by-side and by packaging the passive electronic part 4 and the active electronic part 5 that have been made into two IC chips with a single insulating armor 6 through electrical bonding, they can be produced as a single IC part.

In this case, unlike the first type of MMIC described earlier, it is not necessary to implement the various types of machining in order to form the passive IC circuit at a ceramic IC package. Because of this, by using the passive electronic part 4 made into a passive IC chip according to the present invention, a cheaper IC part can be supplied to a manufacturer of semiconductor parts compared to a case in which the ceramic IC packages of the first type are used.

Figure 6:
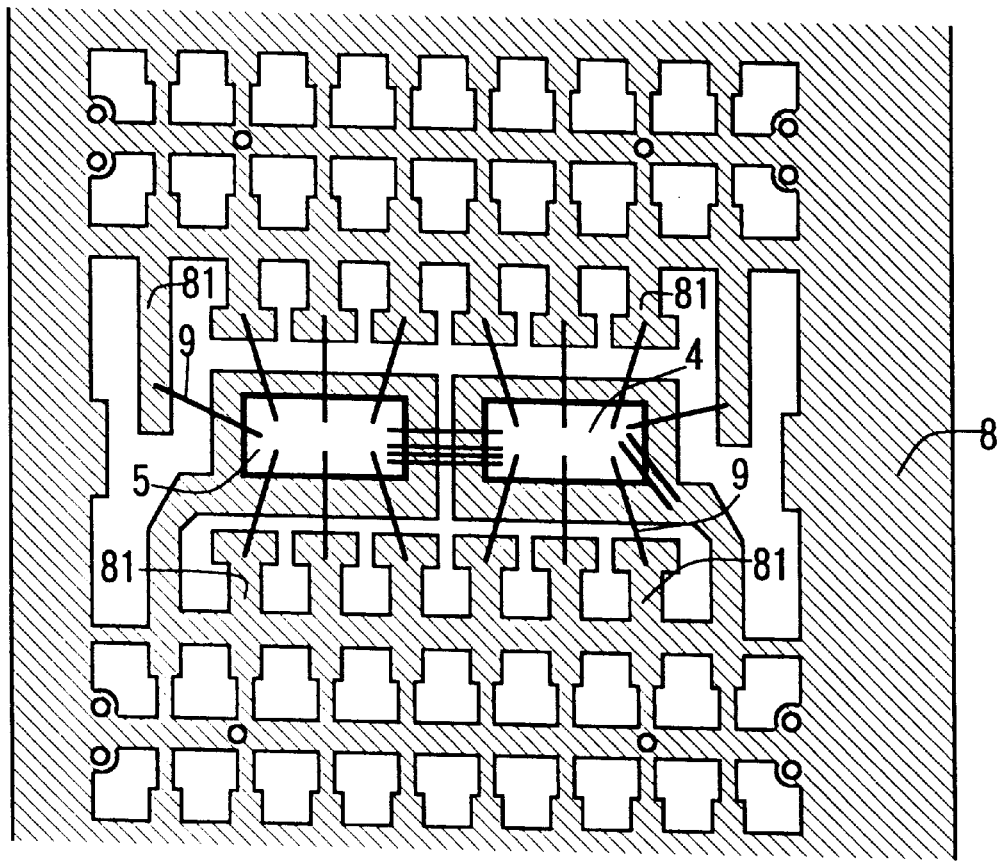
FIG. 6 illustrates a stage in the process implemented in order to obtain the IC part shown in FIGS. 3 to 5.

Referring to FIG. 6, the passive electronic part 4 and the active electronic part 5 are mounted on an IC lead frame 8 and, in this state, they are bonded with bonding wire 9. The signal output of the active electronic part 5 at the amplification stage is directly wire bonded to the passive electronic part 4 at a rear stage. As a means for reducing the inductance generated by the wire used for wire bonding at this point, connections may be made using a plurality of wires. This is a desirable method to employ for connecting the GND electrode, especially when it is used in a high frequency band.

After the wire bonding is performed on the lead frame 8, by resin molding the passive electronic part 4 and the active electronic part 5, they are made into an IC package, and then a lead portion 81 of the lead frame 8 is cut and the lead portion 81 is formed to achieve the IC part shown in FIGS. 3 to 5.

In this IC part, the passive electronic part 4 according to the present invention, which employs the substrate 1 containing the ceramic constituent as well as the glass constituent, achieves a greater strength than a part employing a substrate constituted of glass only. Thus, the substrate does not become cracked or damaged when mounting the passive electronic part 4 onto the lead frame 8 with a mounting machine or when ultrasonic waves are used for making connections during wire bonding.

Figure 7:
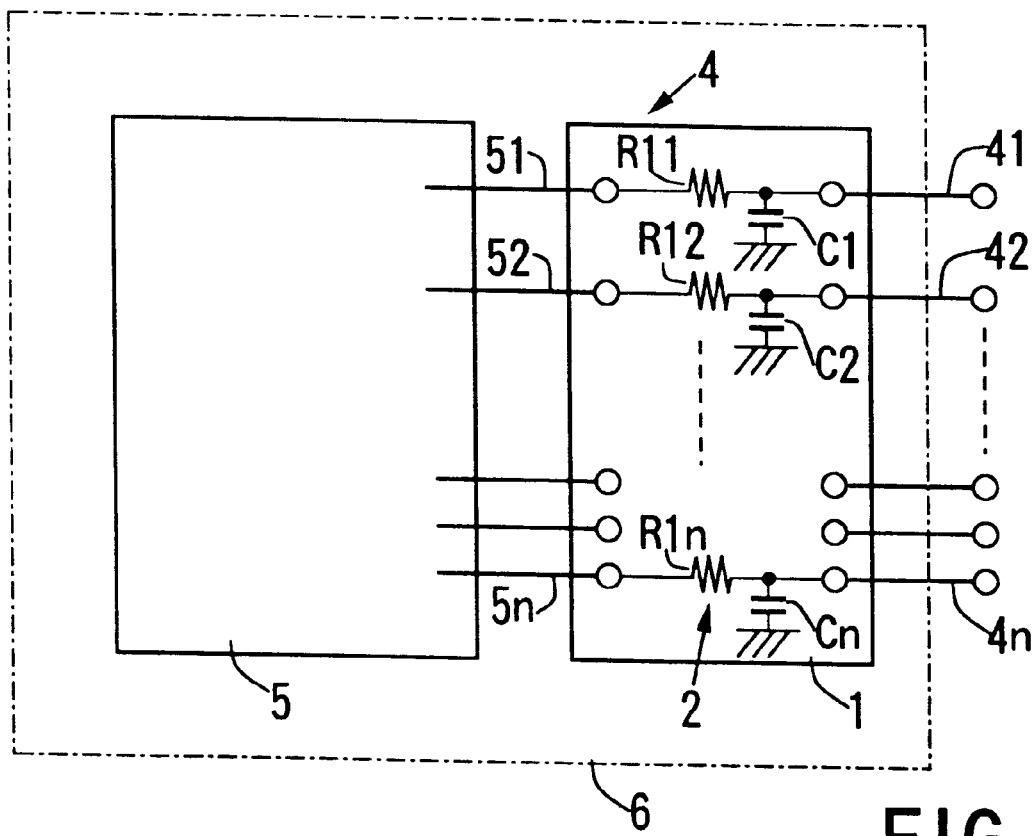
FIG. 7 shows another embodiment of the IC part using the passive electronic part according to the present invention.

Referring to FIG. 7, an active electronic part 5 such as a microprocessor and the passive electronic part 4 according to the present invention are combined. The passive electronic part 4 and the active electronic part 5 are both IC chips. As shown in FIGS. 3 and 4, the active electronic part 5 and the passive electronic part 4 are covered by an insulating armor 6 and is integrated to achieve an IC part.

The passive electronic part 4 in FIG. 7 is inserted into bus lines 51 to 5$n$ that perform input/output of the signal to and from the active electronic part 5 as a noise filter. The passive electronic part 4 is made into an IC chip by positioning a CR filter constituted of capacitors C1 to Cn and resistors R11 to R1n in an array on an inorganic insulating layer constituting the substrate 1. The passive electronic part 4 is provided with output signal lines 41 to 4$n$. The resistors R11 to R1$n$ may be constituted of nickel and chrome thin film resistors.

Figure 8:
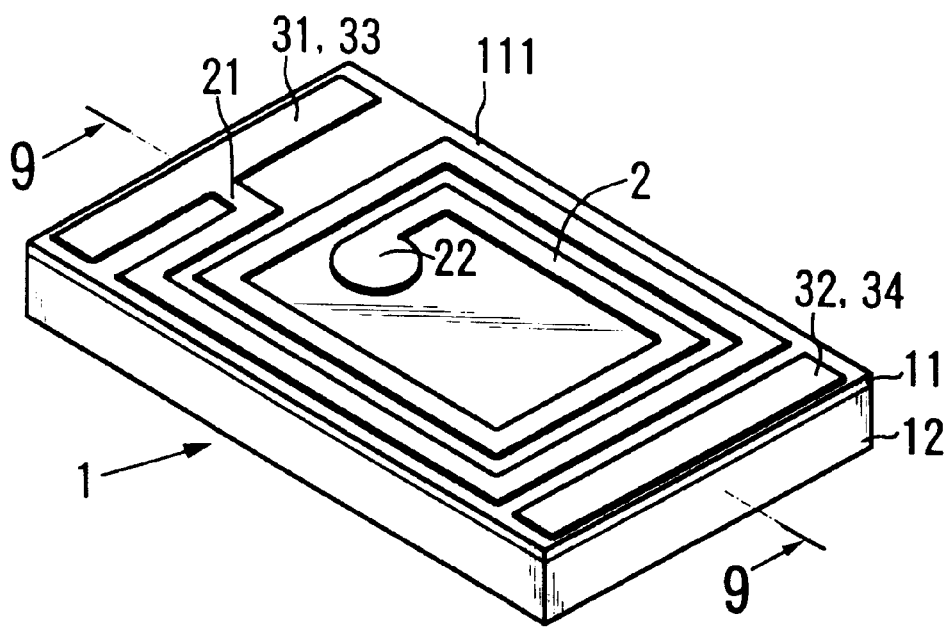
FIG. 8 is a perspective of another embodiment of the passive electronic part according to the present invention.
Figure 9:
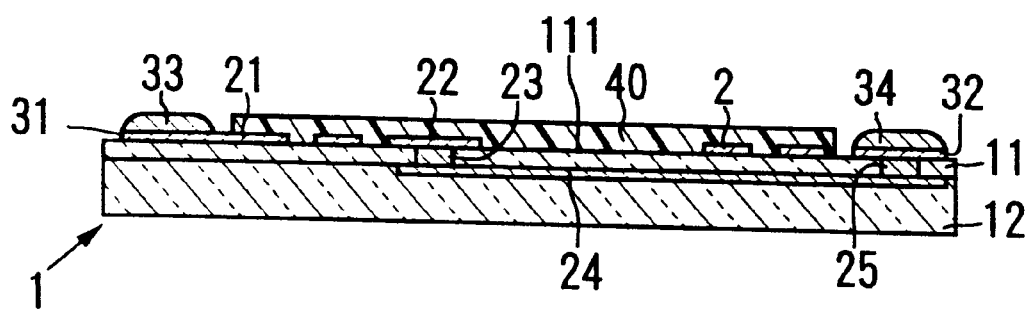
FIG. 9 is a cross section taken along line 9—9 in FIG. 8.
Figure 10:
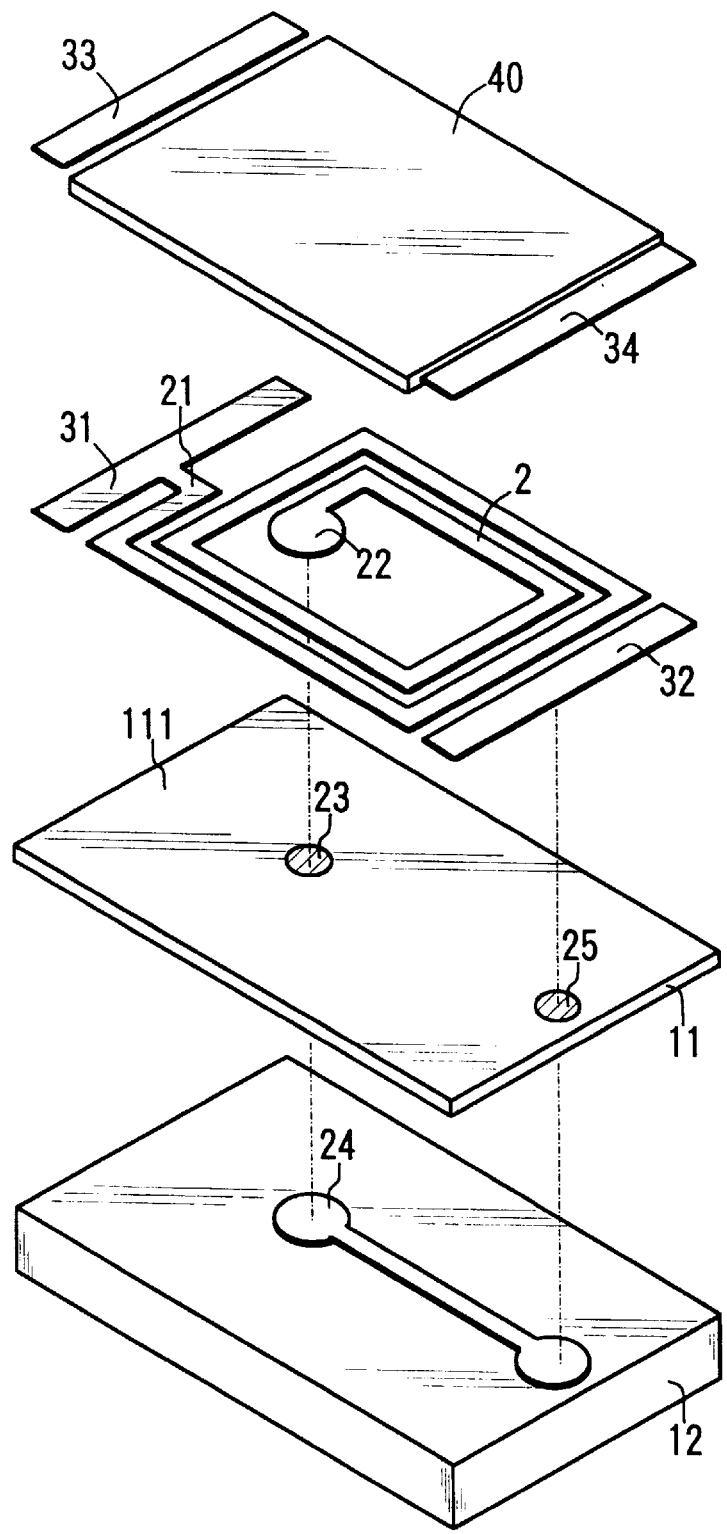
FIG. 10 is an exploded perspective given only for facilitating understanding of the structure of the passive electronic part shown in FIGS. 8 and 9.

Referring to FIGS. 8 to 10, the passive electronic part includes a substrate 1 and a conductor pattern 2. The substrate 1 is provided with at least one inorganic insulating layer 11. The inorganic insulating layer 11, which is constituted of a compound composition comprising a ceramic constituent and a glass constituent, is provided with a polished surface 111. The conductor pattern 2 is provided on the polished surface 111 and constitutes a passive circuit.

The types of ceramic constituent and glass constituent and their desirable composition ratio for constituting the inorganic insulating layer 11 are as explained earlier. In this embodiment, too, advantages similar to those explained in reference to the embodiment shown in FIGS. 1 and 2 are achieved.

In this embodiment, too, the conductor pattern 2 is employed as an element that constitutes the passive circuit. More specifically, the passive circuit includes at least one of; an inductor, a capacitor and a resistor. The passive circuit above may be constituted as a single-function element, or a functional circuit that combines several may be structured. Typical examples of a functional circuit achieved through such combination include a filter, a coupler and the like.

The passive electronic part illustrated in reference to this embodiment is particularly suited as a functional circuit employed in a high frequency range. When constituting a functional circuit, the conductor pattern 2 may be formed by using a conductor constituted of gold, silver, copper or the like, which offers low resistance in a high frequency band. In the passive electronic part in the embodiment, the conductor pattern 2 is formed as a spiral coil.

In the embodiment, the substrate 1 includes a reinforcing layer 12. The reinforcing layer 12 is integrated with the inorganic insulating layer 11 on the opposite side from the surface 111 of the inorganic insulating layer 11. By providing the reinforcing layer 12, sufficient strength can be assured in the substrate 1 while reducing the thickness of the inorganic insulating layer 11. While the reinforcing layer 12 may be constituted of a material other than that constituting the inorganic insulating layer 11, it is desirable to constitute the reinforcing layer 12 with the same material as that constituting the inorganic insulating layer 11 from the viewpoint of simplifying the manufacturing process.

The passive electronic part according to the present invention may be achieved as a single-function chip part such as a coil, a capacitor, a resistor or the like. In addition, it may be adopted in an LCR complex circuit part such as a filter, a coupler or the like. In the embodiment, it is formed as a chip coil. As a means for achieving a chip coil, a spiral conductor pattern 2 and two terminal electrodes 31 and 32 for external connection are provided on the inorganic insulating layer 11. The terminal electrodes 31 and 32 are formed on the same surface as that where the conductor pattern 2 is formed. With such a structure, since the conductor pattern 2 and the terminal electrodes 31 and 32 can be formed through the same process, a high degree of efficiency in mass production is achieved, thereby achieving a cost-related advantage.

While one of the lead portions of the conductor pattern 2, i.e., the lead portion 21, is directly connected to the terminal electrode 31, the other end portion 22 of the conductor pattern 2 is connected to one end of the through-hole electrode 23, which passes through the inorganic insulating layer 11 in the direction of its thickness. The other end of the through-hole electrode 23 is connected to one end of a lead conductor 24, which is formed between the inorganic insulating layer 11 and the reinforcing layer 12. The other end of the lead conductor 24 is connected to one end of a through-hole electrode 25, which passes through the inorganic insulating layer 11 in the direction of its thickness. The other end of the through-hole electrode 25 is connected to the terminal electrode 32 formed on the surface 111 of the inorganic insulating layer 11.

The surface of the conductor pattern 2 is covered with a protective film 40 (see FIG. 9) so that the conductor pattern 2 is protected from oxidation in the outside atmosphere. In addition, solder films 33 and 34 with flat surfaces or with distended portions are formed on the terminal electrodes 31 and 32 respectively.

Figure 11:
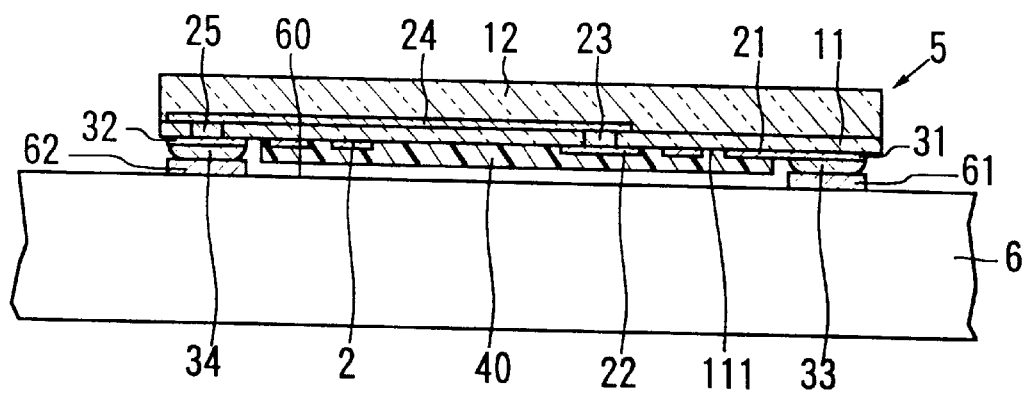
FIG. 11 is a partial cross section of the passive electronic part constituted of a chip coil shown in FIGS. 8 to 10, mounted at the motherboard

FIG. 11 shows the passive electronic part 4 constituted of the chip coil shown in FIGS. 8 to 10 in a state in which it is mounted at a motherboard 6. As shown in the figure, the chip coil 5 constituting the passive electronic part according to the present invention is mounted on the motherboard 6 with the surface 111 where the conductor pattern 2 is formed turned to face the opposite mounting surface 60 of the motherboard 6. The solder layers 33 and 34 provided on the terminal electrodes 31 and 32 are fused on electrodes 61 and 62 on the motherboard 6 through a heat treatment such as soldering reflow. With this, the terminal electrodes 31 and 32 of the chip coil 5 and the electrodes 61 and 62 on the motherboard 6 are both electrically and mechanically connected.

While a single-function chip coil has been explained in reference to the embodiment above, the present invention may be adopted in a passive electronic part such as a filter, a coupler or the like. Next, specific examples of such applications are explained in reference to FIGS. 12 to 14.

Figure 12:
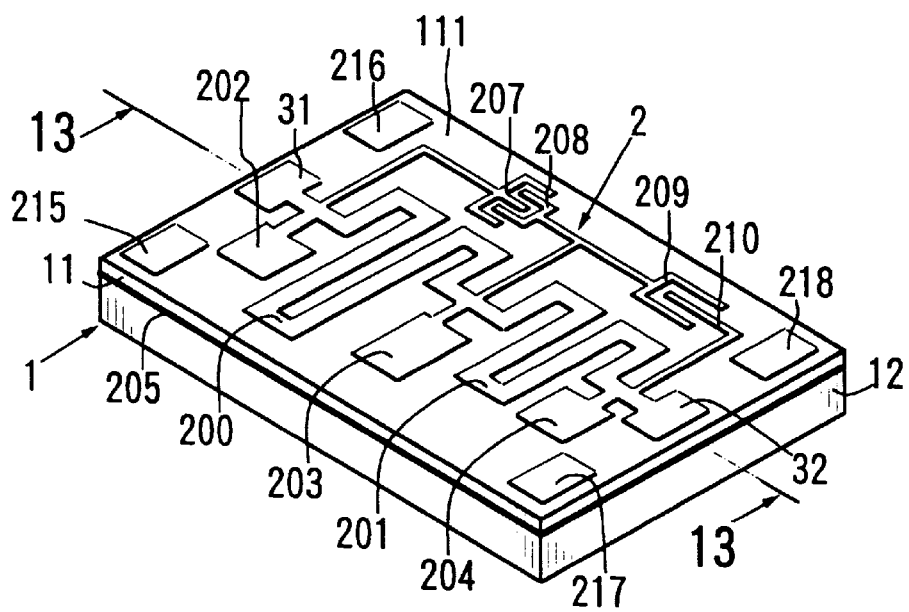
FIG. 12 is a perspective of a low pass filter constituted of the passive electronic part according to the present invention.
Figure 13:
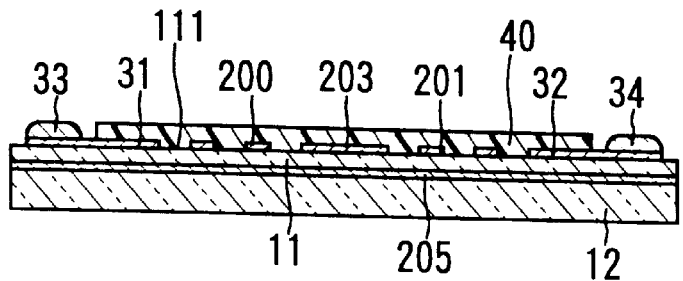
FIG. 13 is a cross section taken along line 13—13 in FIG. 12.

FIGS. 12 and 13 show an example in which the passive electronic part according to the present invention is constituted as a low pass filter. The low pass filter in this embodiment includes a substrate 1 and the conductor pattern 2. The substrate 1 is provided with an inorganic insulating layer 11 that has a polished surface 111. The conductor pattern 2 is provided on the polished surface 111.

Conductor patterns 200 and 201 constituted of microstrip lines are formed on the polished surface 111 of the inorganic insulating layer 11. The line impedances and the lengths of the lines must be determined for the conductor patterns 200 and 201 so that they can respectively achieve their required inductances. The lengths of the lines can be determined freely on the surface of the substrate 1. The line impedance is designed by taking into consideration the width and thickness of the microstrip line, the thickness and dielectric constant of the inorganic insulating layer 11 inserted between the microstrip line and the GND electrode.

In the embodiment, the reinforcing layer 12 is backed. With such a structure, when the thickness of the inorganic insulating layer 11 is changed, the thickness of the substrate 1 can be maintained at a thickness that assures the required mechanical strength by changing the thickness of the reinforcing layer 12 to a value that will compensate for the change in the thickness of the inorganic insulating layer 11. Thus, by changing the thickness of the inorganic insulating layer 11, the line impedances of the microstrip lines 200 and 201 can be set freely.

In addition, conductor patterns 202, 203 and 204 are formed continuous to the conductor pattern 200 or 201 at the surface 111 of the inorganic insulating layer 11. Furthermore, electrodes 207 to 210 are formed, as well. The electrode 207 and the electrode 208 are formed to face opposite each other and the electrode 209 and the electrode 210 are formed to face opposite each other. At the interface between the inorganic insulating layer 11 and the reinforcing layer 12, a conductor layer 205, which is to constitute a GND electrode is provided over its entire surface.

Furthermore, the terminal electrodes 31 and 32 which are to constitute the input/output electrodes of the low pass filter are formed at the surface 111 of the inorganic insulating layer 11. Reference numbers 215 to 218 indicate GND electrodes used in combination with the input/output terminal electrodes 31 and 32. The GND electrodes 215 to 218 are connected to the conductor layer 205 which is formed inside the substrate 1 by through-hole electrodes 223 to 226 (see FIG. 14) provided at the inorganic insulating layer 11.

It is desirable to form individual electrodes on the surface of the substrate by employing photolithography after applying a conductive paste to a consistent thickness through spin coating or the like. In addition, a protective film 40 is formed on the conductor pattern 2 (see FIG. 13). Moreover, solder layers or solder bumps 33 to 38 are formed on the input/output terminal electrodes 31 and 32 and on the GND electrodes 215 to 218 through a solder precoat treatment (see FIG. 14). Furthermore, the GND electrode 205, the through-hole electrodes and other inorganic insulating layers provided inside the substrate 1 are formed through simultaneous sintering as explained earlier.

Figure 14:
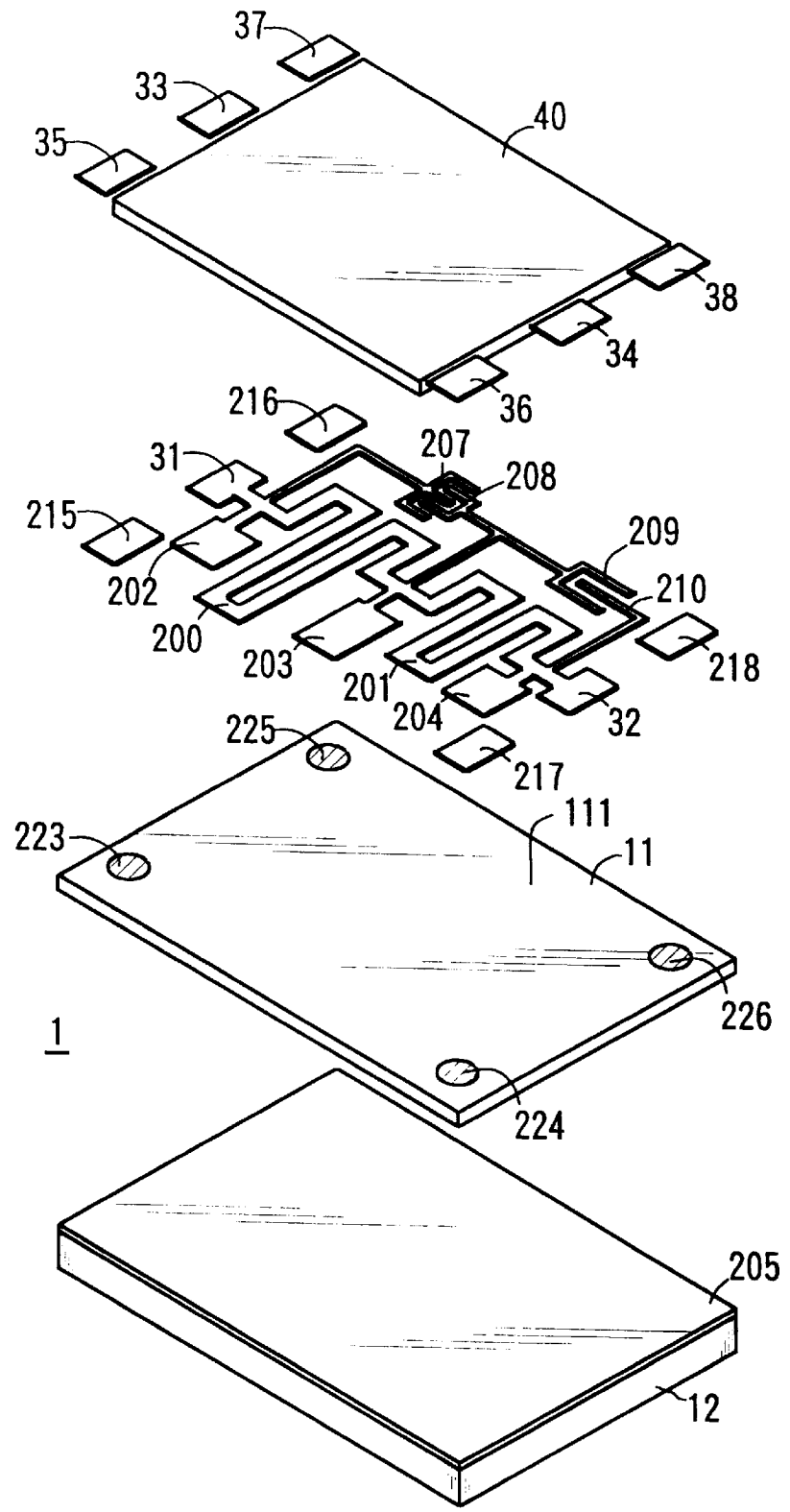
FIG. 14 is an exploded perspective given only for facilitating understanding of the structure of the passive electronic part shown in FIGS. 12 and 13.

Although not shown, the low pass filter in FIGS. 12 to 14 may be achieved by employing an electric circuit identical to that shown in FIG. 2.

Figure 15:
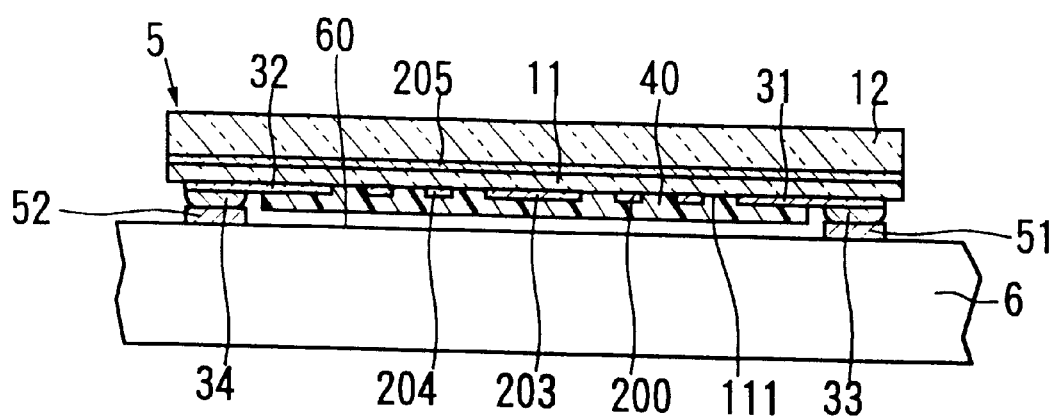
FIG. 15 is a partial cross section of the low pass filter shown in FIGS. 12 to 14, mounted at the motherboard.

FIG. 15 is a partial cross section of the low pass filter shown in FIGS. 12 to 14 in a state in which it is mounted on a motherboard. In the low pass filter 5, the polished surface 111 of the inorganic insulating layer 11 is positioned so that it faces opposite the mounting surface 60 of the motherboard 6. Then, the low pass filter 5 is mounted on the motherboard 6 in such a manner that its input/output terminal electrodes 31 and 32 face opposite terminals 51 and 52 provided on the motherboard 6. Although not shown, the GND terminal electrodes 215 to 218, too, are positioned so that they are positioned on the terminals provided on the mounting surface of the motherboard 6. After this, a heat treatment such as soldering reflow is performed. Since the solder precoat or the solder bumps 33 to 38 are adhered to the surfaces of the input/output terminals 31 and 32 and the GND terminal electrodes 215 to 218, the solder precoat or the solder bumps 33 to 38 become fused through a heat treatment such as soldering reflow.

Through the soldering work described above, the input/output electrodes 31 and 32 of the low pass filter 5 become electrically connected with the terminals 51 and 52 on the motherboard 6 and become fixed to them. Although not shown, the GND terminal electrodes 215 to 218, too, become electrically connected and fixed to the terminals on the motherboard 6. At this point, the GND terminal electrodes 215 to 218 are connected to the GND electrode layer 205 inside the substrate 1 by the through-hole electrodes 223 to 226 also provided inside the substrate 1. In particular, the GND electrode layer 205 provided inside the substrate 1 employs a structure which allows it to electromagnetically shield the circuit pattern 2 formed at the surface 111 of the inorganic insulating layer 11 from the outside (particularly from above).

In the high frequency circuit portion in an actual device, the entirety of the high frequency circuit portion is covered by a metal shield cover. In this structure, the parts that are mounted at the high frequency circuit portion but do not have their upper surfaces shielded by the GND potential will be subject to the influence of the GND potential imparted by the shield cover, which will result in a change in the frequency characteristics. This tendency becomes more marked as the frequency becomes higher. With the electromagnetic shield structure in the embodiment, this phenomenon can be avoided.

Although not shown, it is also possible to constitute an IC part (see FIGS. 3 to 7) by employing the chip coil shown in FIGS. 8 to 10 and the low pass filter shown in FIGS. 12 to 14.

Figure 16:
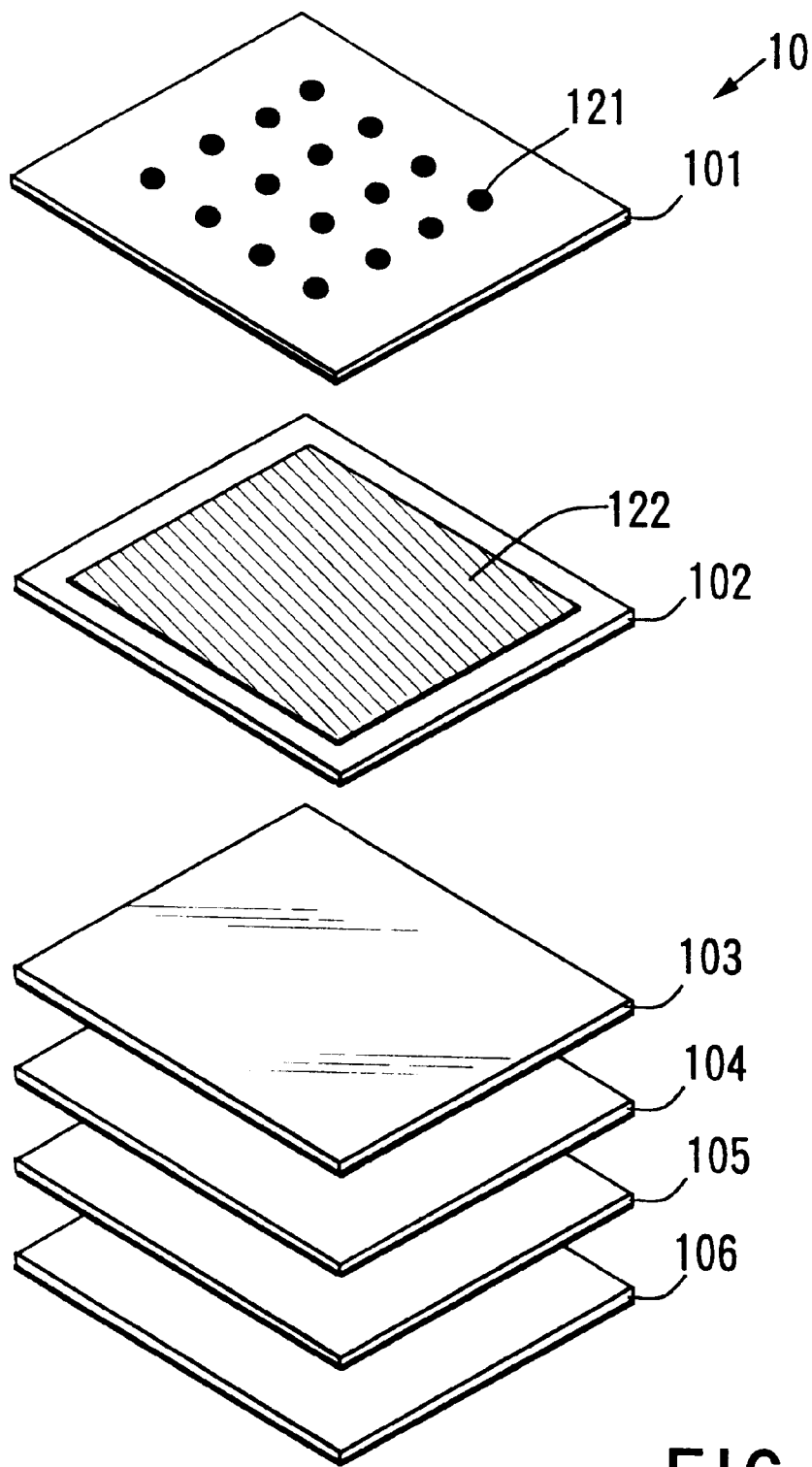
FIG. 16 illustrates a manufacturing process for manufacturing the substrate according to the present invention.

Next, the method for manufacturing the substrate 1 is explained in reference to FIGS. 16 to 20. First, as shown in FIG. 16, a plurality of unfired inorganic insulating sheets 101 to 106 are sequentially laminated. Of the inorganic insulating sheets 101 to 106, a plurality of through-hole electrodes are formed in the sheet 101, and their land patterns 121 emerge at the surface of the sheet 101. The through-hole electrodes and their land patterns 121 are formed by filling a conductive paste into through-holes formed by punching the inorganic insulating sheet 101. In addition, a conductor film 122 which is to constitute a GND electrode is formed on the sheet 102. The inorganic insulating sheets 103 to 106 are laminated in order to adjust the thickness of the entire substrate and their number and the like are arbitrary.

The inorganic insulating material for constituting the organic insulating sheets 101 to 106 is selected to suit individual purposes of use. For instance, when the substrate is to be used in a high frequency band exceeding 100 MHz, it is desirable that the dielectric constant of the insulating material be at or less than 15 and even more desirable at 10 or less. If the dielectric constant is too great, the floating capacity between the formed patterns cannot be disregarded in a high frequency band as above, resulting in difficulty in pattern design.

In addition, when employing spin coating and the like, it is necessary that the substrate provide good cutting characteristics for machining. Consequently, a compound composition achieved by mixing a glass material that will constitute the base material with a ceramic material that will constitute the aggregate is ideal for constituting the inorganic insulating sheets 101 to 106.

In order to obtain the compound composition described above, the constituents should be selected to suit individual purposes of use. In an application such as a high frequency passive electronic part, one or more of the following should be selected as appropriate in correspondence to the requirements for the dielectric constant ($\epsilon r$) explained above, the required firing temperature and the like: alumina ($\epsilon r \approx 10$), magnesia ($\epsilon r \approx 9$), spinel ($\epsilon r \approx 9$), silica ($\epsilon r \approx 4$), mullite ($\epsilon r \approx 6.5$), forsterite ($\epsilon r \approx 6$), steatite ($\epsilon r \approx 6$), cordierite ($\epsilon r \approx 5$), strontium feldspar ($\epsilon r \approx 4$), quartz ($\epsilon r \approx 4$), zinc silicate ($\epsilon r \approx 4$), zirconia ($\epsilon r \approx 10$) and the like.

It is desirable that the content of the glass in the inorganic insulating sheets 101 to 106 be at or greater than 50% and, in particular 60 to 70% by volume. If the glass content is not within the range given above and is less than 50%, it is difficult to achieve a composite structure, and the strength and moldability become reduced. In addition, it is desirable that the glass constituent provide a dielectric constant approximately the same as that of the ceramic constituent which constitutes the aggregate. Specific examples that satisfy this requirement include those that are normally employed as glass frits such as borosilicate glass, lead borosilicate glass, borosilicate barium glass, borosilicate strontium glass, borosilicate zinc glass borosilicate potassium glass and the like. Borosilicate potassium glass and borosilicate strontium glass are particularly ideal. A specific example of the composition of the glass may be: $SiO_2$:50 to 65 wt %, $Al_2O_3$:5 to 15 wt %, $B_2O_3$:8 wt % or less, one to four of the following: $K_2O$, $CaO$, $SrO$, $BaO$ and $MgO$:15 to 40 wt %, $PbO$: 30 wt % or less. One or more selected from $Bi_2O_3$, $TiO_2$, $ZrO_2$, $Y_2O_3$ and the like may be added to the composition described above at 5 wt % or less.

A substrate material having a composite structure achieved by mixing such a glass material to constitute the base material and a ceramic material to constitute the aggregate can be fired at a low temperature. While there are no restrictions imposed upon the electrode materials for constituting the coil conductors and the capacitors, it is desirable to use a conductor material with a low resistance that can be fired at a temperature of 1000° C. or less, such as Au, Ag, Ag—Pd, Cu, Pt and the like according to the present invention.

It is desirable to employ the green sheet method to manufacture the laminated body comprising the inorganic insulating sheets 101 to 106, since through its method, simple and stable formation between the individual layers is achieved. In the green sheet method, first, a green sheet which is to constitute a substrate material is prepared. The ceramic particles which are to constitute the aggregate are mixed into the glass frits and to this mixture, a vehicle constituted of a binder, a solvent and the like is added. This mixture is kneaded until it is in a paste state (slurry), and by using this paste, a specific number of green sheets with a preferred thickness of 0.05 to 0.5 mm are prepared using the doctor blade method, the extrusion method or the like. In this case, the particle size of the glass should be approximately 0.1 to 5 $\mu$m, the ceramic particle size should be 1 to 8 $\mu$m. The binder included in the vehicle may be ethyl cellulose, polyvinyl butyryl or an acrylic resin. Specific examples of the acrylic resin include methacrylic resin, butyl methacrylate. Specific examples of the solvent include ethyl cellulose, terpineol, butyl carbitol. Apart from the above, the selections may be made from various dispersing agents, activators, plasticizers and the like as necessary to suit individual purposes.

Next, using a punching machine and a die press, through-holes are formed in the green sheets as necessary. Then, by employing, for instance, screen printing, through-hole electrodes and land patterns 121 are formed in the inorganic insulating sheet 101 and a conductor film 122 is formed at the inorganic insulating sheet 102. The through-hole electrodes and land patterns 121 of the inorganic insulating sheet 101 are formed by filling a conductive paste into the through-holes in the inorganic insulating sheet 101. As explained above, the conductive paste should preferably be prepared by mixing conductive particles and glass frits, by adding a vehicle to this mixture and by kneading the mixture to achieve a slurry. It is desirable to set the content of the conductive particles at approximately 80 to 95 wt %. In addition, the average particle size of the conductive particles should be approximately 1.01 to 5 µm.

After placing the inorganic insulating sheets 101 to 106 shown in FIG. 16 on top of one another, heat pressing is performed at 40 to 120° C. and at 50 to 1,000 kg/cm² to achieve an integrated inorganic insulating sheet laminated body. During this process, the binder is removed from the laminated body through heat treatment (binder removal), and firing is performed by holding the laminated body for approximately 10 minutes at a temperature of 1,000° C. or less, preferably at approximately 800 to 1,000° C. and even more desirably at a temperature within the range of 850 to 900° C. Air, $O_2$ or an inert gas such as $N_2$ may be used as the firing atmosphere. Air is particularly desirable since it can be obtained easily and at low cost. However, if Cu is used as the conductor material, it is desirable to perform the firing in an inert gas. Through these processes, the substrate is completed.

Figure 17:
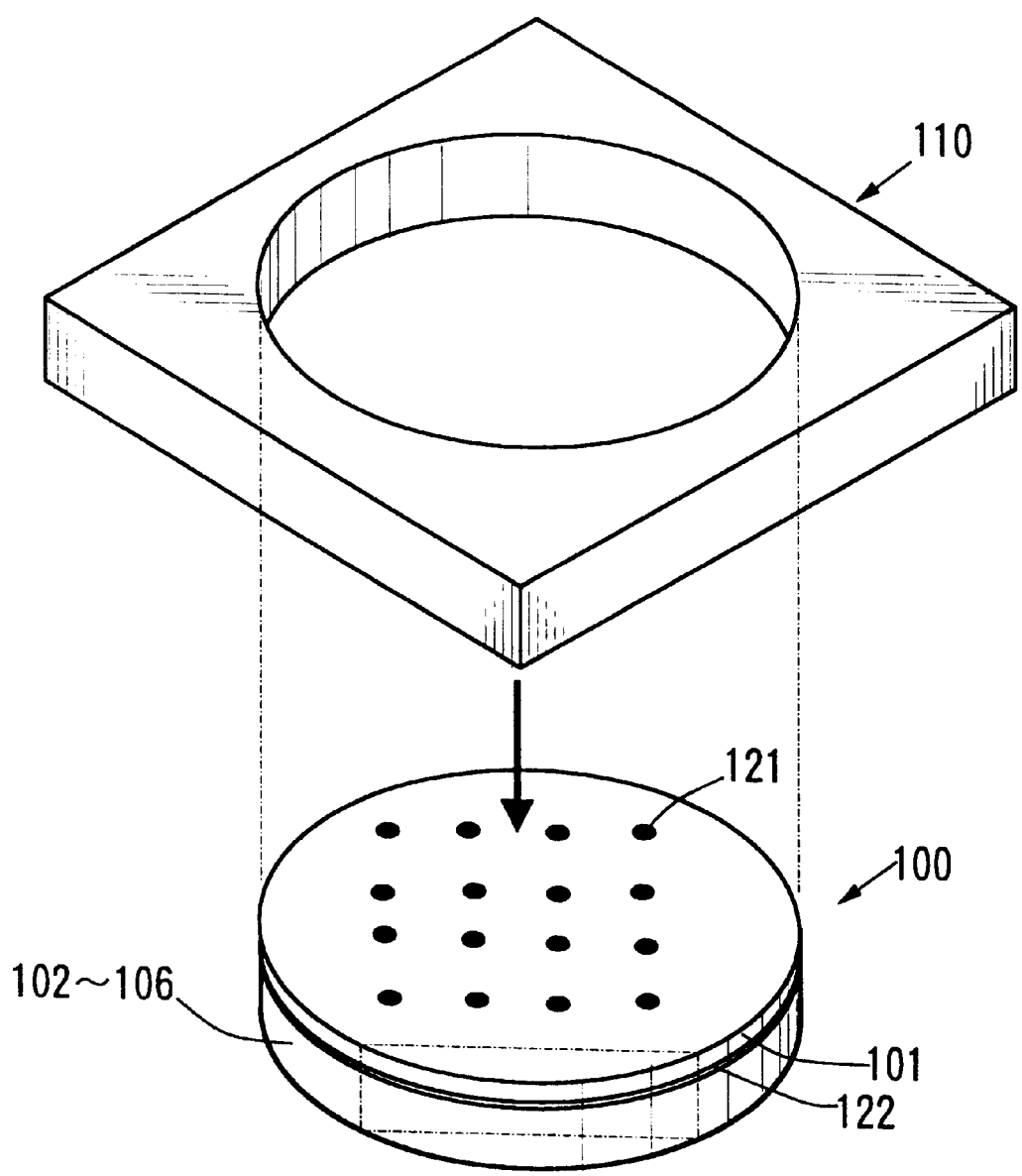
FIG. 17 illustrates a process following the process shown in FIG. 16.

After this, as shown in FIG. 17, blanking is performed to extract a wafer 100 from the substrate 110. The wafer 100 with a diameter of 3 inches should be machined to an accuracy of approximately 100 microns. Thus, a conductor pattern can be formed on the surface of the wafer 100 by employing the spin coat method and photolithography. This wafer extraction may be performed either before or after firing the laminated body. However, in the embodiment, since the wafer 100 is constituted of a compound composition comprising a glass constituent and a ceramic constituent, it is desirable to perform machining after firing.

While it is easy to machine the laminated body into the wafer before firing since the laminated body is in a soft state, it is necessary to perform machining again after firing in order to achieve the accuracy in the wafer form as described above because a post-firing contraction (so-called firing shrinkage) occurs through the firing process.

In contrast, if machining is performed after firing, although the wafer 100 itself has hardened due to the firing, since the glass constituent makes up 50 vol. % or more and, even more desirably, at 60 to 70 vol. %, good cutting is assured. Thus, blanking employing an ultrasonic machine can be implemented easily.

The wafer 100 thus obtained will have an overall warp since it has gone through the firing process. In order to form the conductor pattern 2 by adopting the spin coat method, photolithography and the like with a semiconductor manufacturing apparatus, the wafer 100 must be mounted in a vacuum chuck. In addition, in order to form the conductor pattern 2 with a photo mask, the wafer 100 must have good adhesion to the photo mask, the photo resist must be applied evenly and light must be radiated evenly. For these reasons, it is necessary to polish (lap) the surface of the wafer 100 to limit the warp in the wafer 100 to, for instance, approximately 10 microns or less.

Since the wafer 100 assures good cutting, as explained earlier, lapping can be performed easily. With this, the warp in the wafer 100 is removed and, furthermore, a high degree of smoothness of the wafer surface is achieved.

Figure 18:
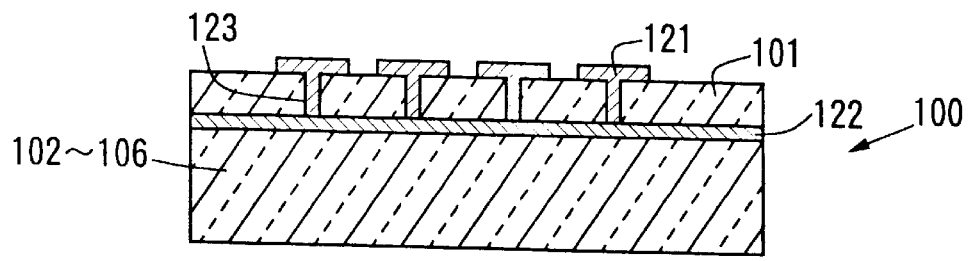
FIG. 18 shows the wafer cross section before lapping
Figure 19:
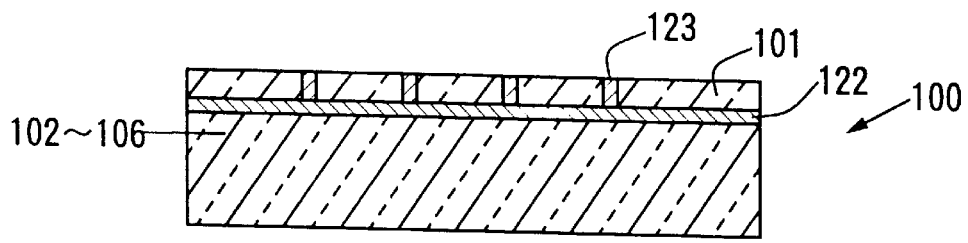
FIG. 19 shows the wafer cross section after lapping.

FIG. 18 shows a cross section of the wafer 100 before lapping and FIG. 19 shows a cross section of the wafer 100 after lapping. Through lapping, the land patterns 121 of the through-hole electrodes at the surface of the wafer 100 are removed so that the through-hole electrodes 123 occupying a smaller area than that occupied by the land patterns are exposed. This, a degree of freedom with which the circuit pattern can be designed at the surface of the wafer 100 increases.

Moreover, when forming the conductor pattern 2, the spin coat method is employed to apply a conductive paste and photoresist to the surface of the wafer 100, ensuring consistent coating. Spin coating is performed by dropping the conductive paste and photoresist and dispersing them over the surface of a rotating wafer 100. When employing the spin coat method, the wafer 100 should be prepared in a disk shape with a portion of its external circumferential edge beveled. Since the wafer 100 assures good cutting, this beveling process can also be implemented easily.

Figure 20:
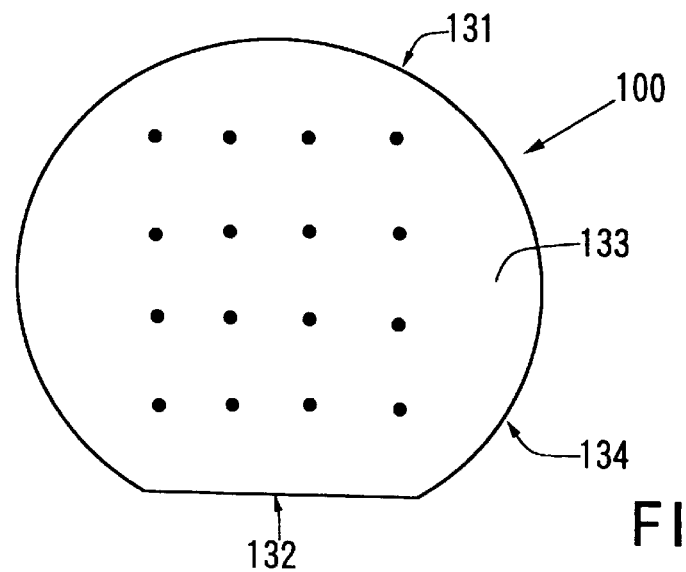
FIG. 20 shows the locations where the wafer is machined.

FIG. 20 shows all the locations at which the wafer 100 is machined. As shown in the figure, polishing of the external circumferential surface 131, blanking in the orientation flat 132 with an ultrasonic machine, lapping the surface 133 of the wafer 100 and beveling of the edge 134 of the wafer 100 and the like are performed on the wafer 100. Since the wafer 100 is constituted of a compound composition comprising a glass constituent and a ceramic constituent, all of these processes can be implemented easily. The same well-established methods as those employed for machining semiconductor wafers are adopted for the lapping and beveling mentioned above. Since the wafer 100 assures better cutting than a semiconductor wafer, it can be naturally machined over a shorter length of time compared to a semiconductor wafer.

Now, a method for manufacturing a chip coil (see FIGS. 1 to 8) which is the passive electronic part according to the present invention using the wafer 100 obtained through the processes described above, is now explained.

The conductive paste is applied through spin coating or the like to the surface 111 of the inorganic insulating layer 11 at a consistent thickness. Since the surface 111 of the inorganic insulating layer 11 is polished, a conductor film with a consistent film thickness can be achieved by applying the conductive paste to the surface 111 of the inorganic insulating layer 11 to a preset consistent thickness and by sintering the applied conductive paste film. It is desirable to perform mirror polishing on the surface of the fired conductor film afterwards to improve the accuracy of the pattern to be formed later.

Then, a photoresist film is formed through spin coating or the like on the conductor film, and by applying a photographic technology, a photo mask is adhered to the conductor film to perform exposure and development, and an etching resist film with a desired pattern is formed. After this, by immersing the exposed portion of the conductor film formed on the surface 111 of the inorganic insulating layer 11, which is not covered by the etching resist film, in an etching solution, conductor etching is performed to form a desired conductor pattern 2.

Instead of following the process described above, photolithography may be employed after spin coating the conductive paste onto the surface 111 of the inorganic insulating layer 11. In that case, after forming the desired conductor pattern, the conductive paste film is sintered. In particular, if the conductive paste 2 is provided with a function as a photoresist, only one application process need be implemented, thereby reducing the number of manufacturing steps to be performed and improving mass productivity.

In addition, it is desirable to form a protective film 40 with a resin or the like. For this purpose, spin coating and photolithography can be employed as in the process described above. Alternatively, since the same degree of accuracy as that required for the conductor pattern 2 is not required in the pattern of the protective film 40, it may be formed through printing or the like.

Furthermore, it is desirable to form the solder precoat or the solder bumps 33 to 38 (see FIGS. 2 and 12) by depositing a soldering metal or printing a solder paste, and then by performing heat treatment through soldering reflow or the like.

While an explanation has been given in reference to specific embodiments by referring to the drawings, the present invention may also assume the following modes.

(1) While the present invention is adopted in a high frequency amplifier in the embodiments, it may be adopted in another functional block of a high frequency circuit including a mixer, a modulator or the like.

(2) The application of the present invention is not limited to a low pass filter and a wide range of applications may be made as long as it is adopted in a passive circuit, such as a band pass filter, a high pass filter, a band rejection filter, a coupler, a phase shifter or the like.

(3) The GND electrode does not necessarily have to be provided covering the entire surface of the inorganic insulating layer, and instead it may be provided as a pattern. Furthermore, it may be provided in multiple layers.

(4) A capacitor may also be formed by forming a dielectric layer on the conductor pattern formed on the inorganic insulating layer and then by forming another conductor layer on top of the dielectric layer. In addition, a structure such as that in which a dielectric layer and the like are formed on the conductor pattern of the coil and microstrip lines and conductor patterns are further formed on top of the dielectric layer to reduce the conductor resistance of the conductor patterns may be also adopted.

(5) We have already explained that the present invention may be adopted as a chip capacitor or a chip resistor as well as a chip coil. When adopted in a chip capacitor, a structure in which the electrodes are placed facing opposite each other on the surface of the substrate is optimal to achieve a chip capacitor with a high degree of accuracy which fully utilizes the advantages of photolithography technology. In addition, a chip capacitor with a normal capacitor structure in which a dielectric layer is enclosed by conductors added on to the substrate may also be achieved. The dielectric layer, which is enclosed by conductors, is formed by applying a dielectric paste through spin coating, and if the dielectric layer is constituted of ceramic, firing is performed, whereas if the dielectric layer is constituted of resin, hardening is performed at an appropriate temperature. When a resin dielectric layer is used, it is necessary to go through a thin film process such as sputtering or deposition when forming electrodes on the dielectric layer.

The terminal electrodes in a chip resistor can be formed by following a process similar to those employed for achieving a chip coil. When forming a resistor portion, too, a similar process to that performed when using a conductive paste can be adopted by using a resistor paste and, therefore, a manufacturing method similar to that employed for manufacturing a chip coil can be adopted.

(6) Instead of forming a solder precoat and solder bumps on the terminal electrodes, the terminal electrodes may be utilized as electrodes for wire bonding such as are used in an IC or the like. This application is suited for multi-chip module (MCM) in an IC part.

(7) It is also possible to use a substrate which is an IC package called ball grid array and mount the active electronic part and the passive electronic part on the substrate in parallel. In this structure, since solder bumps may be formed on external connection electrodes of the passive electronic part according to the present invention, it is possible to employ the flip chip mounting technology when mounting the passive electronic part and the semiconductor IC chips on the substrate, after which they are sealed with a resin.

(8) Etching deficiencies which are caused by conductors entering scratches on the polished surface of the glass-ceramic substrate can be avoided by following the steps of a) polishing the surface of the glass-ceramic substrate b) coating the surface of the glass-ceramic substrate with a material which is identical to that of the glass-ceramic substrate by means of printing or the like;

c) forming a conductor on the surface of the glass ceramic layer; and d) forming conductor patterns on the surface of the glass-ceramic layer by means of photolithography.

INDUSTRIAL APPLICABILITY

The present invention provides the following possibilities for industrial application.

(a) a passive electronic part with which a conductor pattern is made finer with a high degree of accuracy to improve the accuracy of the constant values of the individual circuit elements to be formed and circuit elements and a functional circuit that comprises an aggregate of the circuit elements can be designed while requiring only a small pattern area, is provided.

(b) a passive electronic part provided with a substrate with a smooth surface which is free of defects or warpage is provided.

(c) a passive electronic part provided with a substrate which assures good cutting and superior mass productivity is provided.

What is claimed is:

1. A passive electronic part comprising:
   a substrate having an inorganic insulating layer comprising a mixture of a ceramic material and a glass material throughout the inorganic insulating layer, said inorganic insulating layer having a polished surface; and
   a passive circuit including at least one conductive pattern on the polished surface of said inorganic insulating layer.

2. The passive electronic part of claim 1, wherein said at least one conductive pattern includes a coated conductive film comprising a conductive paste, said conductive paste being heated and then patterned through photolithography.

3. The passive electronic part of claim 1, further comprising:
   at least one external connection electrode on a surface of said substrate and having a solder coating or a solder bump.

4. The passive electronic part of claim 1, wherein said ceramic material includes at least one substance selected from the group consisting of alumina, magnesia, spinel, silica, mullite, forsterite, steatite, cordierite, strontium feldspar, quartz, zinc silicate and zirconia;
   said glass material includes at least one type selected from the group consisting of borosilicate glass, lead borosilicate glass, borosilicate barium glass, borosilicate strontium glass, borosilicate zinc glass and borosilicate potassium glass; and said content of said glass material is at 60 to 70 vol. %.

5. The passive electronic part of claim 1, wherein said substrate includes:

a reinforcing layer integrated with said inorganic insulating layer at a side opposite from said polished surface of said inorganic insulating layer; and a conductor film between said inorganic insulating layer and said reinforcing layer.

6. The passive electronic part of claim 1, comprising an IC chip provided with a conductor pattern for wire bonding on said polished surface.

7. An IC part comprising:

at least one passive electronic part including:

a substrate having an inorganic insulating layer comprising a mixture of a ceramic material and a glass material throughout the inorganic insulating layer, said inorganic insulating layer having a polished surface, and a passive circuit on the polished surface of said inorganic insulating layer, and including at least one conductive pattern on said polished surface, an insulating armor covering said passive electronic part; and a lead conductor connected to said passive electronic part inside said insulating armor to be led out to the outside of said insulating armor.

8. The IC part of claim 7, further comprising:

an active electronic part positioned side-by-side in a lateral direction relative to said passive electronic part, wherein said insulating armor covers said passive electronic part and said active electronic part to form one package.

9. The IC part of claim 8, further comprising:

a ball grid array including said active electronic element and said passive electronic element mounted on said substrate.

10. A wafer comprising:

a substrate having an inorganic insulating layer comprising a mixture of a ceramic material and a glass material throughout the inorganic insulating layer, said inorganic insulating layer having a polished surface; and a plurality of passive electronic part elements including a conductor pattern on the polished surface of said inorganic insulating layer.

11. The wafer of claim 10, wherein said ceramic material includes at least one substance selected from the group consisting of alumina, magnesia, spinel, silica, mullite, forsterite, steatite, cordierite, strontium feldspar, quartz, zinc silicate and zirconia;

said glass material includes at least one type selected from the group consisting of borosilicate glass, lead borosilicate glass, borosilicate barium glass, borosilicate strontium glass, borosilicate zinc glass and borosilicate potassium glass; and said content of said glass is at 60 to 70 vol. % or greater.

12. The passive electronic part of claim 1, wherein the polished surface of the inorganic insulating layer comprises a smooth surface having a warp which is less than or equal to 10 microns.

13. The IC part of claim 7, wherein the polished surface of the inorganic insulating layer comprises a smooth surface having a warp which is less than or equal to 10 microns.

14. The wafer of claim 10, wherein the polished surface of the inorganic insulating layer comprises a smooth surface having a warp which is less than or equal to 10 microns.

* * * * *